United States Patent
Kodama et al.

(12) 
(10) Patent No.: US 6,452,261 B1
(45) Date of Patent: Sep. 17, 2002

(54) FLAT SEMICONDUCTOR DEVICE AND POWER CONVERTER EMPLOYING THE SAME

(75) Inventors: Hironori Kodama, Hitachi; Masahiro Nagasu, Hitachinaka; Hirokazu Inoue, Naka-gun; Yasuo Osone, Tsuchiura; Shigeta Ueda; Kazuji Yamada, both of Hitachi, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/380,645
(22) PCT Filed: Mar. 26, 1997
(86) PCT No.: PCT/JP97/01011
 § 371 (c)(1),
 (2), (4) Date: Sep. 7, 1999
(87) PCT Pub. No.: WO98/43301
 PCT Pub. Date: Oct. 1, 1998
(51) Int. Cl.⁷ .............................................. H01L 23/48
(52) U.S. Cl. ................ 257/688; 257/689; 257/693; 257/698; 257/699; 257/723; 257/725; 257/712; 257/713; 257/718; 257/719
(58) Field of Search ................................. 257/688, 689, 257/693, 698, 699, 723, 725, 712, 713, 718, 719

(56) References Cited

U.S. PATENT DOCUMENTS 5,489,802 A * 2/1996 Sakamoto et al. ........... 257/688
5,610,439 A * 3/1997 Hlyoshi et al. .............. 257/688

* cited by examiner

*Primary Examiner*—David L. Talbott
*Assistant Examiner*—Luan Thai
(74) *Attorney, Agent, or Firm*—Antonelli, Terry, Stout & Kraus, LLP

(57) ABSTRACT

Control electrode wirings which are led out from control electrodes over a number of chips built in a flat package and insulating members which are provided in order to insulate the control electrode wirings from main electrode wirings are also given function of positioning of the respective semiconductor chips in the flat package. Further, a one-piece control electrode wiring net is housed in the common electrodes of the package and the electrodes which are led out from the control electrodes of the respective semiconductor chips are connected to the net to simplify the processing of a large number of gate signal wirings.

4 Claims, 15 Drawing Sheets

[TOP VIEW]  [SIDE VIEW]

FIG. 19

| Rated voltage (kV) | Rated current (kA) | Chip size (Active area) | Number of chips mounted | | |
|---|---|---|---|---|---|
| | | | IGBT | Diode | Total |
| 3.5 | 1000 | 14 mm square (120 mm$^2$) | 30 | 20 | 50 |
| 4.0 | 1800 | 16 mm square (170 mm$^2$) | 35 | 20 | 55 |
| 5.0 | 3000 | 14 mm square (120 mm$^2$) | 80 | 40 | 120 |
| 5.0 | 3000 | 15 mm square (150 mm$^2$) | 65 | 35 | 100 |

FLAT SEMICONDUCTOR DEVICE AND POWER CONVERTER EMPLOYING THE SAME

FIELD OF THE INVENTION

The present invention relates to a flat-type housing semiconductor device having a plurality of semiconductor chips which are connected in parallel in a single package and to a power converter employing the same.

BACKGROUND OF THE INVENTION

The power-electronics technology which controls main circuit current by means of the semiconductor electronics technology has been used in various applicable fields and further its application range is expanding. Recently, in particular, the world has been paying great attention to insulated-gate bipolar transistors (IGBT) and metal-oxide-silicon field-effect transistors (MOSFET) which are MOS control devices using signals applied to MOS gates to control main currents. The IGBTS, for example, have been widely used as power-switching devices for motor pulse-width-modulation (PWM) inverters.

Said MOS control device has main electrodes (emitter electrodes) and control electrodes (gate electrodes) disposed on the primary surface of the semiconductor chip and main electrodes (collector electrodes) on the secondary surface of the chip.

Accordingly, when a semiconductor package is made, the main electrodes and control electrodes on the primary surface must be lead out separately and individually through the external leads. For this purpose, the conventional module type packages such as the IGBT employs forming main electrodes for the secondary surface directly on the metallic base which also works as a radiator, wire-bonding the main electrodes (emitter electrodes) and the control electrodes (gate electrodes) to the related external leads with electrically-conductive wires such as aluminum wires, and thus leading them out of the package. Recently, larger-capacity semiconductor chips have been required eagerly. As one of such semiconductor chips, there has been a module type package having a plurality of IGBT chips (few chips to ten chips) whose electrodes are interconnected in parallel by wire-bonding. Such a package radiates heats generated in the package only from one side of the package, namely from the side of collectors which are directly formed on the metallic base. Therefore, such a package has a great thermal resistance and the capacitance of the semiconductor chip is limited to by the number of chips to be mounted and the amperage that is used. As the amperage increases, more wires are required to connect emitter electrodes. Consequently, the inductance of the internal wiring increases and may cause a great surge at the time of switching. As the number of elements in a package increases further, connection of bonding-wires becomes much complicated, which may cause a wire disconnection or short-circuit in the package. Additionally, when a big current is fed to the package, fine bonding wires may be easily blown out by a resulting heat.

To solve said problems, a pressure-contact type package has been proposed. Said package contains IGBT chips in a flat-type package. Their emitter and collector electrodes formed on the main surface are respectively in contact with upper and lower electrodes formed in the package.

For example, Fuji Report Vol.69, No.5 (1996) discloses a flat-type IGBT package of a breakdown voltage of 2.5 KV and an ampacity of 1 KA which includes 12 semiconductor chips (9 IGBT chips and 3 diodes). In Japanese Non-examined Patent Publication No.7-94673, there is disclosed such a flat-type IGBT package that includes 5 IGBT chips and 1 diode.

A representative structural example of said package is illustrated in FIG. 17. As shown in FIG. 17, the secondary surface (working as a collector) of respective chips 1 and 2 is soldered 61 to a single electrode substrate (Mo) 61 formed on a common electrode plate 8 (Cu) of the package. The primary surface (working as an emitter) of each chip is connected to a common electrode plate 7 (Cu) of the package via respective contact terminal element 63 or 64 (Mo) that is separated for each chip. Each semiconductor chip is positioned and secured upright on a predetermined location by positioning guide 66 which is inserted into a slit provided around the chip-mount area on said electrode substrate 61 (Mo). In other words, this positioning guide 66 is used as an outer frame guide to retain the semiconductor chips 1 and 2 and contact terminal elements 63 and 64. The control electrode (gate electrode) of each semiconductor chip is connected to a wiring net on the wiring base 67 provided around the collector electrode substrate 61 by wire-bonding. Further, the contact terminal element has a concave notch to avoid touching the wires.

Similarly, Japanese Non-examined Patent Publication No.8-88240 discloses an embodiment of a flat-type IGBT package containing 21 semiconductor chips (9 IGBTs and 12 diodes). FIG. 18 shows a representative structural example of said package. As shown in FIG. 18, the secondary surface (working as a collector) of respective chips 1 and 2 is formed on a single electrode substrate (Mo) 61 of a common electrode plate 8 (Cu) of the package. The primary surface (working as an emitter) of each chip is connected to a common electrode plate 7 (Cu) of the package via respective pressure-contact plate 63 or 64 (Mo) that is separated for each chip. Each semiconductor chip is positioned and secured by a chip frame 70 formed on each semiconductor chip.

In other words, a chip frame 70 is formed on the outer periphery of each semiconductor chip. The chip frames are arranged in a close-contact manner on an identical surface. The outermost close-contact chip frames are enclosed by an external frame 71. Thus the respective chips are positioned finally. Each chip frame enables securing the chip and the pressure-contact plate 63 or 64 and the external frame 71 positions the gate electrode 4 exactly. The front end of a probe 72 touches the gate electrode 4 of each semiconductor chip. The probe is lead out to the outside of the package by a gate lead wire 74 for respective chip connected to the probe by a socket 73. A groove 75 is formed on the inner surface (pressure-contact surface) of the emitter electrode plate 7 where the chips are in contact with each other (around a portion opposite the semiconductor chip). A plurality of said gate leads 74 are disposed in this groove 75.

Said flat-type housing structures have the following merits in comparison to the conventional module-type packages:

1) Non-wire-connection of main electrodes increases the reliability of connection.

2) The inductances and resistances of connection wires decrease.

3) The semiconductor chip can be cooled at both sides of the chip. This increases the efficiency of cooling.

However, when a semiconductor package requires a great number of semiconductor chips in parallel connection, for example, tens to hundred semiconductor elements for a larger capacity, the packaging methods in the above disclosed embodiments are not enough. In such a case, exact chip positioning and gate wiring may be hard to be accomplished. Furthermore, a great number of gate wires may cause generation of noises and the like which cannot be ignored in the gate circuits due to the increase of wiring inductance. Furthermore, if the breakdown voltage of the chips is increased to satisfy the high breakdown voltage requirement, the chips generate greater heat. This heat causes members of the package to expand and consequently causes positional differences of the members. Therefore, the conventional packaging method is not fit for production of large packages of a high breakdown voltage and a great ampacity.

The present invention has been made considering said problems. It is therefore, an object of the present invention to provide a method of positioning a great number of semiconductor chips in a large flat-type housing semiconductor package at high precision, at low cost, and in a simple way. Another object of the present invention is to make gate signal wiring of a package containing a number of chips simpler and highly reliable. A further object of the present invention is to present power converting equipment which is fit for a large-capacity system by using the above semiconductor device.

SUMMARY OF THE INVENTION

Said first object can be accomplished by giving a function of positioning respective semiconductor chips in the flat-type package to control electrode wires led out from the control electrode of each semiconductor chip and to the insulating member which insulates the wires from the main electrode wires. Preferably the flat-type package should be so constructed that the intermediate electrode formed on the primary main electrode of a semiconductor chip may have a through-hole or a notch and that a control electrode wire coming from the control electrode on the semiconductor chip may connect said through-hole (or notch) made on the intermediate electrode and a hole (or groove) formed in the common electrode plate opposite to the primary main electrode. This structure thus works to lead out control electrode wires from the control electrodes of semiconductor chips and to position said intermediate electrodes relative to the common electrode plate.

Another object of the present invention to make gate signal wiring of a semiconductor package containing a number of chips simpler and highly reliable can be accomplished by housing the net of control electrode wires in the common electrode of the package and connecting the wires led out from the control electrode of each semiconductor chip to the net. It is more preferable that the control electrode wire net formed inside the common electrode of said package is formed in a unit, that the net is formed in a groove provided on the surface of the common electrode, that said groove runs through the related portion of the control electrode of the opposing semiconductor chip, and that the surface which is electrically connected to said led-out electrode of said control electrode wire net faces to the semiconductor chip.

Furthermore, the use of a flat-type semiconductor device of a high breakdown voltage and a great ampacity which contains a number of MOS control devices (IGBT chips) in accordance with the present invention can greatly reduce the volume and production cost of packages in comparison to conventional power converting devices using GTO and the like which have been used in fields requiring high breakdown voltages and great ampacities.

BRIEF DESCRIPTION OF THE DRAWINGS

FIG. 19 lists examples of large-current flat-type housing semiconductor devices.

DESCRIPTION OF THE PREFERRED EMBODIMENTS

The embodiments of this invention will be described in further detail with reference to the accompanying drawings.

Figure 1:
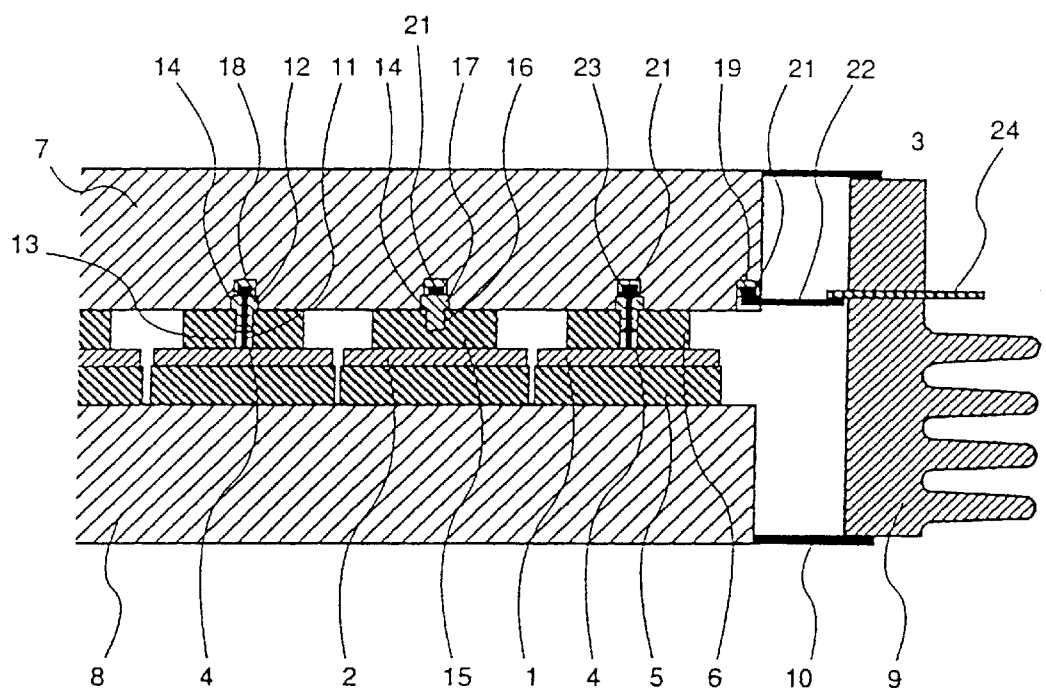
FIG. 1 is a sectional side view illustrating a semiconductor device according to a first embodiment of the present invention.
Figure 2A:
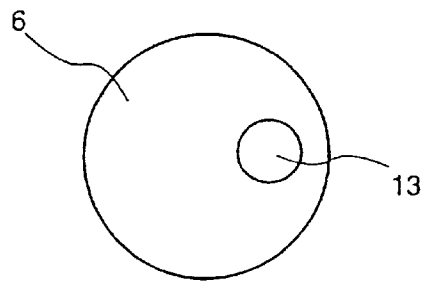
FIG. 2 is a view illustrating shapes of intermediate electrodes.
Figure 2B:
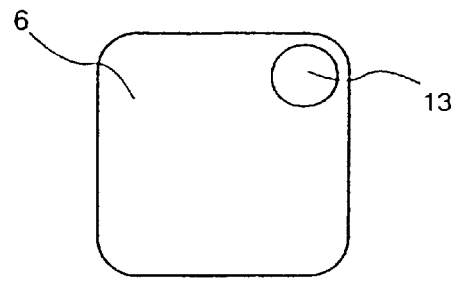
Figure 2C:
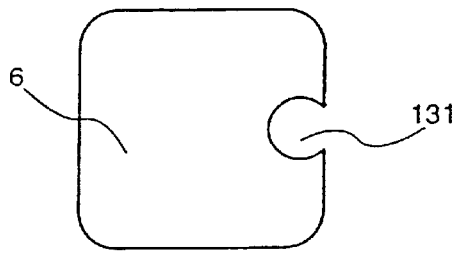
Figure 2D:
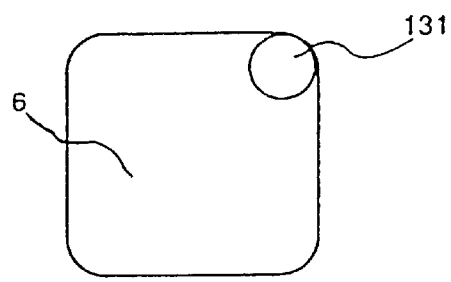
Figure 2E:
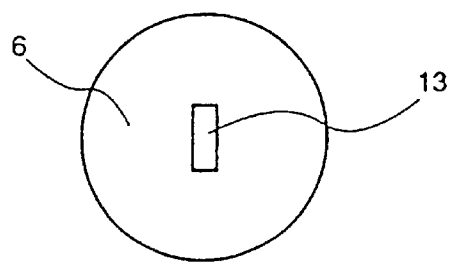
Figure 2F:
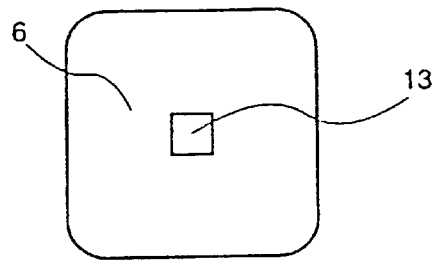

Referring to FIG. 1 which is a sectional side view of an embodiment of a flat-type semiconductor device according to the present invention, a reverse-conduction switching device comprises IGBT chips 1 and fly-wheel-diode (FWD) chips 2.

FIG. 1 shows the rightmost part of the flat-type semiconductor device 3.

The IGBT chip 1 is approximately 16 mm square wide, having an emitter electrode on the almost whole top surface of it which is the primary main surface, a collector electrode on the bottom surface of it which is the secondary main surface, and a control electrode (gate electrode) 4 in the center of the primary main surface. The FWD chip 2 has an anode electrode on the top surface of the silicon substrate and a cathode electrode on the bottom surface of the substrate. Intermediate electrodes 5, 6, and 15 working both to radiate heat and to make electrical connection are securely fixed to the main electrodes of each semiconductor chip. These electrodes are sandwiched between a primary common electrode plate 7 (emitter electrode plate) and a secondary common electrode plate 8 (collector electrode plate). The part between a pair of these electrodes is insulated from the outside by means of an insulating outer cylinder such as a ceramic cylinder and the like. Furthermore, the part between the insulating external cylinder 9 and each of these common electrode plates 7 and 8 is hermetically sealed with a metallic plate 10. However, this hermetic structure is not always required for certain uses.

Below are explained a method of leading out control electrode wires (gate wires) from a number of semiconductor chips and a positioning semiconductor chips on predetermined positions inside the package. First, a control electrode wire is lead out from the control electrode pad 4 on the IGBT chip 1 perpendicularly to the main surface using the lead pin 11. This lead pin 11 is surrounded by an intermediate electrode 6, a common electrode 7, and an insulating member 12 made of heat-proof resin such as Teflon to insulate the lead pin (a tubular member whose dimensions are 4 mm in the top outer diameter, 3 mm in the bottom outer diameter and 1 mm in the inner diameter).

The outer dimensions of the intermediate electrode mounted on the primary main surface are smaller than those of the semiconductor chip to prevent the intermediate electrode from touching the end of the chip of the planer pressure-proof structure. The intermediate electrode 6 disposed on the IGBT chip having a control electrode is a circular part of 12 mm in the outer diameter having a through-hole 13 in the center thereof and its ends are beveled. It is to be expressly understood that said shape of the intermediate electrode is for purpose of explanation and is not intended as a definition of the limits of the invention.

As shown in FIG. 2, for example, the intermediate electrode can have an eccentric hole or notch. Similarly, the hole and the insulating member need not be circular. They can be rectangular. Further, the intermediate electrode 5 facing to the secondary main surface is 17 mm square wide which is a little bigger than the semiconductor chip. The common electrode 7 on the chip side has 4 mm-diameter holes at preset positions where the semiconductor chips are located. In package assembling, said lead-out pin 11 and said insulating member 12 are inserted into the corresponding through-hole 13 of the intermediate electrode and the upper part of the insulating member 12 is fit to the hole 14 of the common electrode plate 7. With this, respective semiconductor chips is positioned in place in the hole position 14. In other words, the means (the lead-out pin 11 and the insulating member 12) for leading out a wire from the control electrode of each semiconductor chip also works as means to determine the position of respective chips on the surface. This means that no additional part is required for positioning and that the number of parts to be used can be reduced greatly. Further, as this positioning does not use the profile of the semiconductor chip or intermediate electrode as the positioning reference, no extra positioning member is required among semiconductor chips. Consequently, the semiconductor chips can be mounted closer to each other by a space occupied by such a positioning member.

In said method, the control electrode 4 is in contact with the lead pin 11 for continuity without being bonded to the lead pin 11. This can eliminate problems such as deterioration of junctions in the package due to differences of thermal expansions of control electrodes, semiconductor substrates, and lead-out pins. In general, when the temperature inside a package changes by an operation of the semiconductor device, materials constituting the package expand by heat. The differences of thermal expansions of materials cause positional differences of materials (lateral movement). In a package structure in which control electrodes are not bonded to lead-out pins, this positional difference will disconnect the control wires. However in the package structure according to the present invention, when the positioning hole 14 in the common electrode 7 positionally moves by the thermal expansion of the common electrode 7, the leadout pin 11 and the insulating member 12 also move as the hole 14 moves. At the same time, the intermediate electrode 6 and the semiconductor chip 1 which are positioned by the lead-out pin 11 and the insulating member 12 move together with them. Accordingly, the relative positional relationship between the intermediate electrode 6 and the semiconductor chip 1 will remain unchanged. Namely, it is apparent that the package structure of this method has a self-alignment function. Furthermore, in this method, the control electrode pad 4 mounted on the semiconductor chip and the lead-out pin provided over the pad work as the center axis to position the semiconductor chip and the intermediate electrode. Accordingly, each semiconductor chip and each intermediate electrode thermally expand relative to this axis and consequently the relative positional relationship between the control electrode pad and the lead-out pin remain unchanged relative to the center axis. Accordingly, the embodiment of FIG. 1 greatly increases the reliability of connection between the control electrode pad and the lead-out pin. This method is effective to packages having greater chips, packages having a great number of chips, or packages of greater sizes.

The intermediate electrode 15 formed on the FWD chip 2 has a non-through-hole 16. The position of each semiconductor chip is determined by inserting the insulating member 17 to this hole 16 and a hole 14 formed on the common electrode 7. It is possible to make the non-through-hole 16 on the intermediate electrode 15 through to share the intermediate electrode part by the IGBT chip. It is also possible to substitute the insulating member 17 by the other insulating member 12 for the IGBT which has a pin hole in its center. Furthermore, it is possible to omit positioning the FWD chips by said insulating member 17 when the FWD chips are not on the outermost periphery of the package and can be positioned exactly by the surrounding IGBT chips. This can reduce the part machining costs and the number of parts to be used.

Of course, it is apparent that this packaging method of the present invention is available to a flat-type housing semiconductor device comprising only semiconductor switching elements such as IGBTs (without diodes). Besides that, this packaging method is effective to a large-capacity semiconductor device in which a great number of diode chips are singly positioned and mounted as described above.

Figure 3:
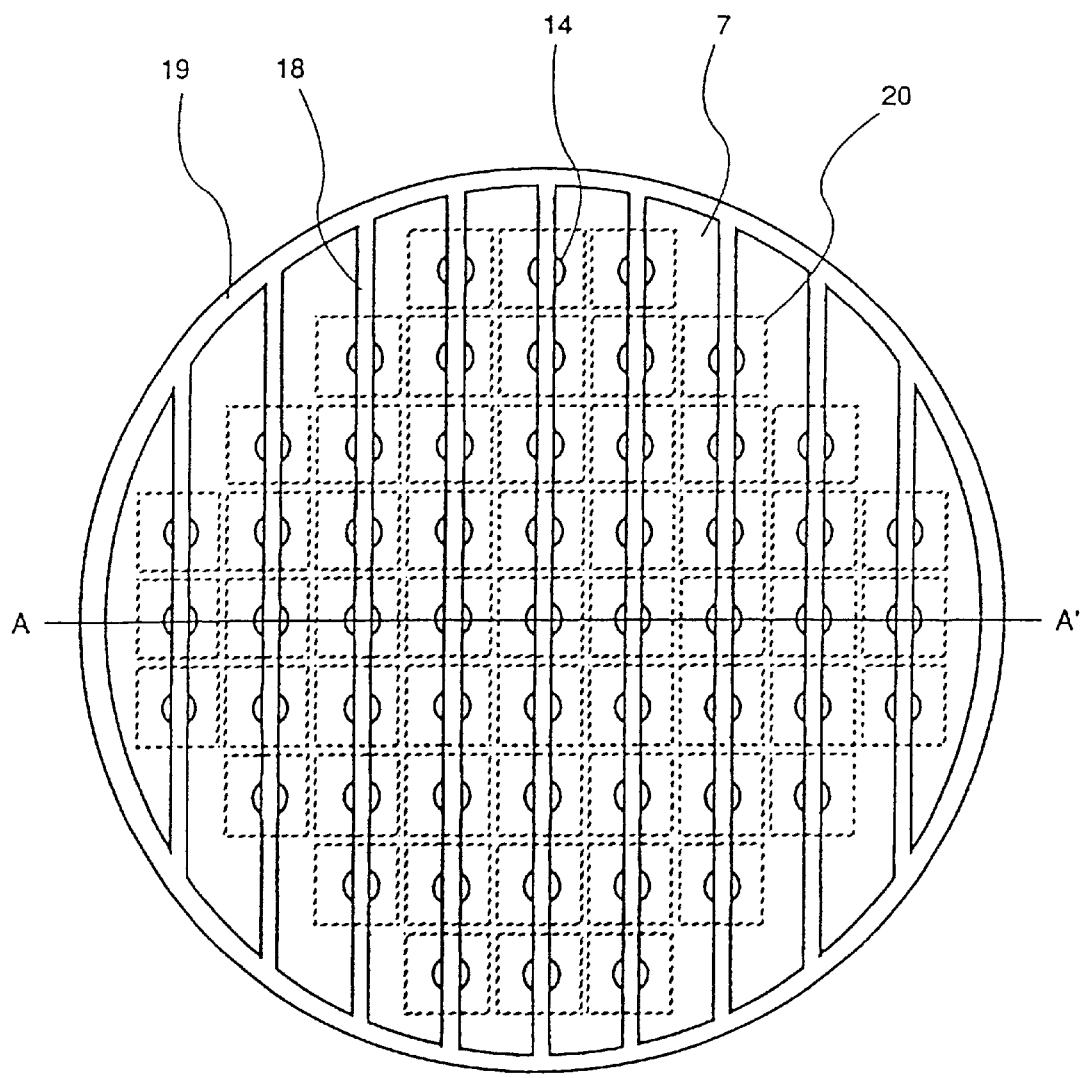
FIG. 3 is a plane view from the semiconductor chip side, illustrating the common electrode used by a first embodiment of the present invention.
Figure 4A:
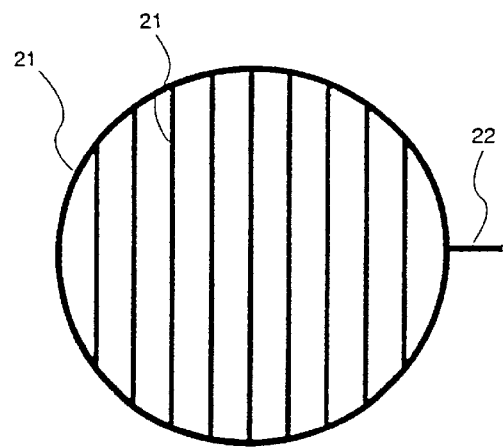
FIG. 4 is a plane view of a control electrode wire net of the present invention.
Figure 4B:
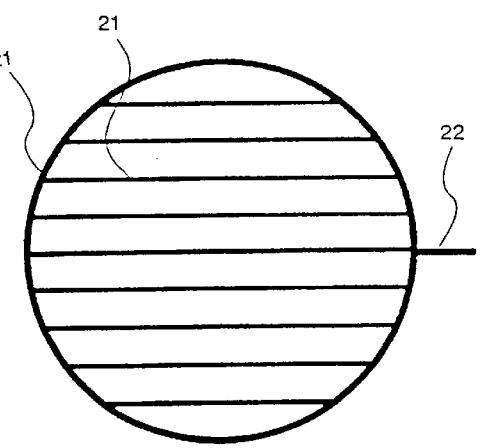
Figure 4C:
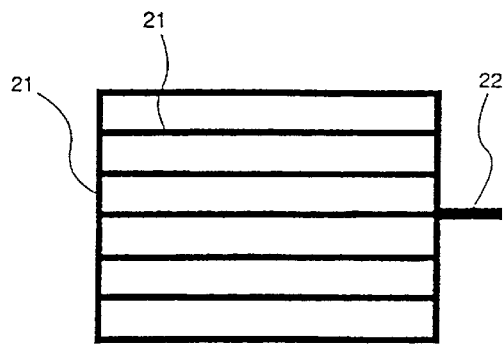
Figure 4D:
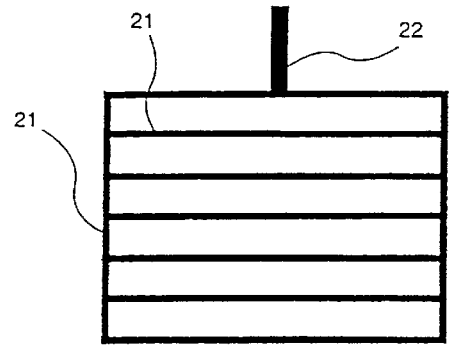

Referring FIG. 3 illustrating the primary common electrode 7 viewed from the semiconductor chip side, the A—A section in FIG. 3 relates to the sectional position of the common electrode 7 of FIG. 1. The common electrode 7 has a number of parallel grooves 18 on the inner surface of the electrode and a groove 19 on the outer periphery of the common electrode 7. The width of each groove is 3 mm or less. The grooves 18 have 4 mm-diameter holes 14 to accept said lead-out pin 11 and said insulating member 12 in each of them at predetermined intervals at locations where semiconductor chips are placed. Each dotted box 20 indicates a location where a semiconductor chip is placed. In other words, the grooves 18 are formed so that each groove may run over the control electrode of each opposing semiconductor chip, that is over the center of each semiconductor chip as for the embodiment of the present invention. The grooves 18 running in parallel are open at both ends of the common electrode and the groove 19 running on the outer periphery of the common electrode can be a step-like groove. Therefore these grooves 18 and 19 can be machined easily.

Referring FIG. 4 illustrating the typical shapes of control electrode wire nets 21 and collecting terminals 22 each of which is connected to the control electrode wire net 21 to lead out a control electrode to the outside of the semiconductor device, (a) and (b) respectively show the shapes of control electrode wire nets to be set in the grooves 18 and 19 of the common electrode illustrated in FIG. 2. (c) and (d) respectively show the other shapes of control electrode wire nets as examples. When using one of these control electrode wire nets, a groove to fit for the selected control electrode wire net must be formed on the common electrode. Also in this case, the grooves had better be open at both ends of the control electrode plate for easier machining. The control electrode wires are connected to each other on the circumference to form a single wire net. When the control electrode wire net is set in the control electrode plate, the circumferential part of the net secure the position of the net. Each control electrode wire net has a collecting terminal 22 that leads out the control signal wire to the outside of the package. It is possible to make the collecting terminal 22 by the same material as that of the control electrode wire net or to bond another part as the collecting terminal 22 when varying the wire size or material of the collecting terminal. The free end off the collecting terminal 22 is soldered to the external lead-out terminal 24 which is hermetically provided in the insulating outer cylinder 9 as shown in FIG. 1.

This control electrode wire net 21 set in the groove with the net insulated from the control electrode 7 by the insulating material 23. The pin 11 led out from the control electrode 4 of a semiconductor chip is connected to said control electrode wire net 21 through the center hole of the insulating member 12. With this, a compact and effective gate wire net can be formed in the common electrode of the package. These wire nets can be punched out from a thin metallic sheet or made of a combination of some parts. Said wire nets can also be punched out from a combination member such as TAB tape comprising a wiring material and an insulating material.

Thinner wiring and insulating materials and thinner grooves are preferable because they occupy less volumes and areas of electrodes and grooves. In accordance with this packaging method, the groove can be made finer as only one gate lead wire is set in the groove. Furthermore, the groove can be made thinner as this method does not use wire-bonding and consequently any space for wire-bonding is not required. The narrower grooves can make chips get closer to each other and enable production of high-density packaging.

Additionally, the built-in control electrode wiring of the present invention has an effect of being less influenced by the main circuit wiring (main circuit current and voltage). In other words, the main circuit wire flows a large current at a voltage which varies greatly (by some thousand voltages), generating electromagnetic or electrostatic noises which may affect the control electrode wiring. A resulting current change may cause a current to flow through some selected semiconductor chips only. However, the packaging structure of the present invention can protect the control electrode wiring against electric influences due to potential changes of the collector electrodes. This is because the control electrode wire net is disposed perpendicularly to the main circuit and because the control electrode wire net is buried in the emitter electrode whose potential is constant and the emitter electrode works to generate a shielding effect.

Figure 5:
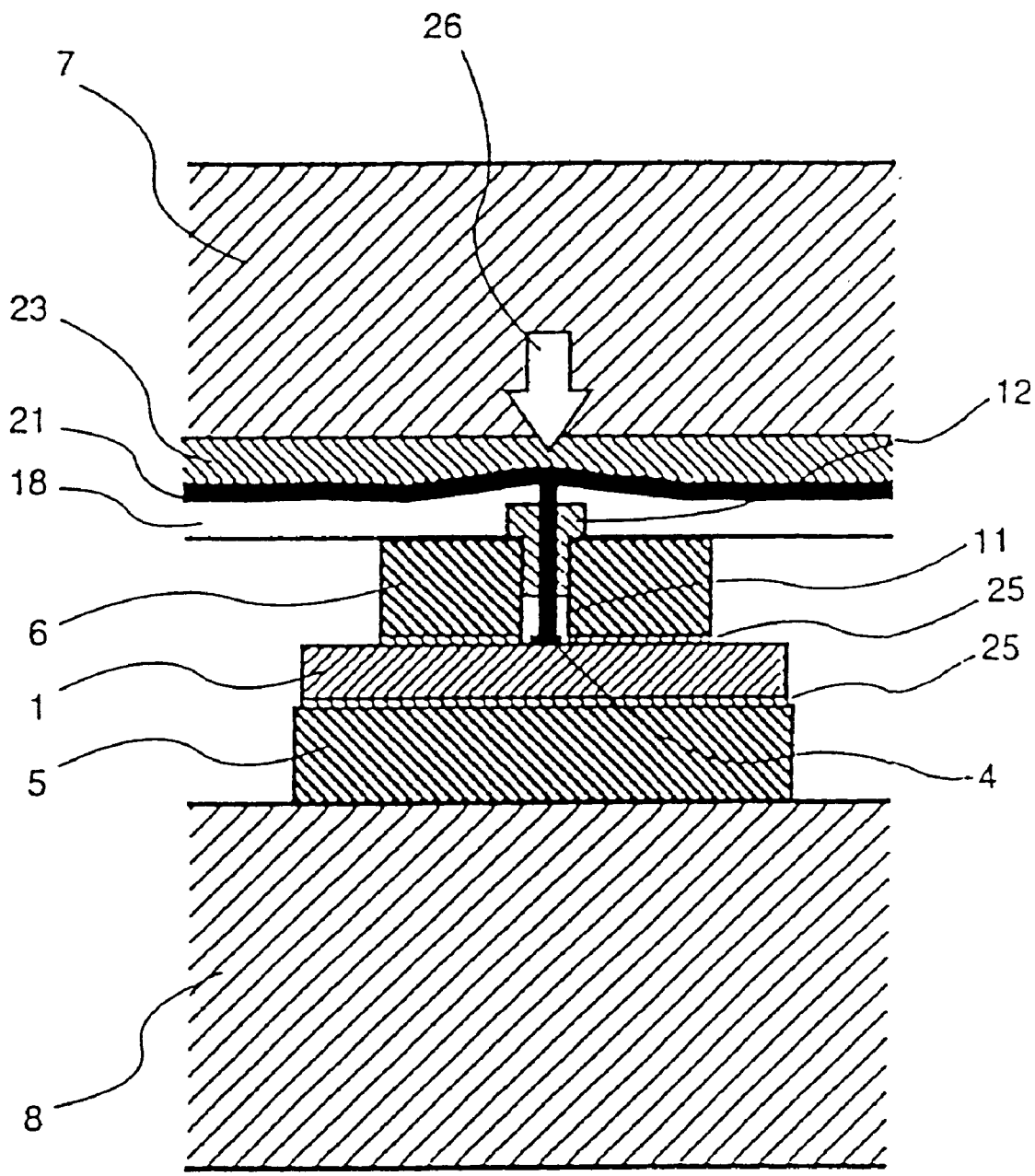
FIG. 5 is a sectional view in parallel to the control electrode wire net of the semiconductor device according to a second embodiment of the present invention.
Figure 6:
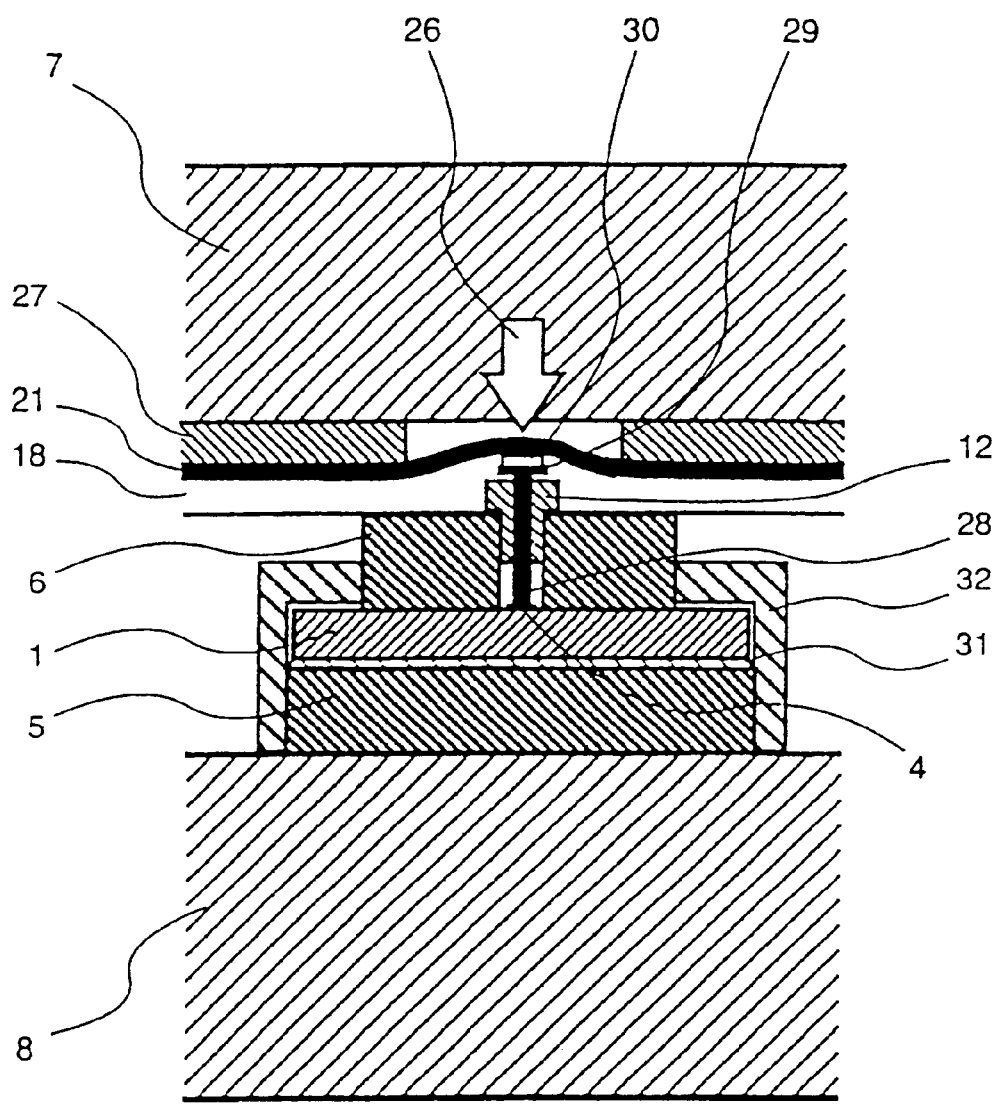
FIG. 6 is a sectional view in parallel to the control electrode wire net of the semiconductor device according to a third embodiment of the present invention.
Figure 7:
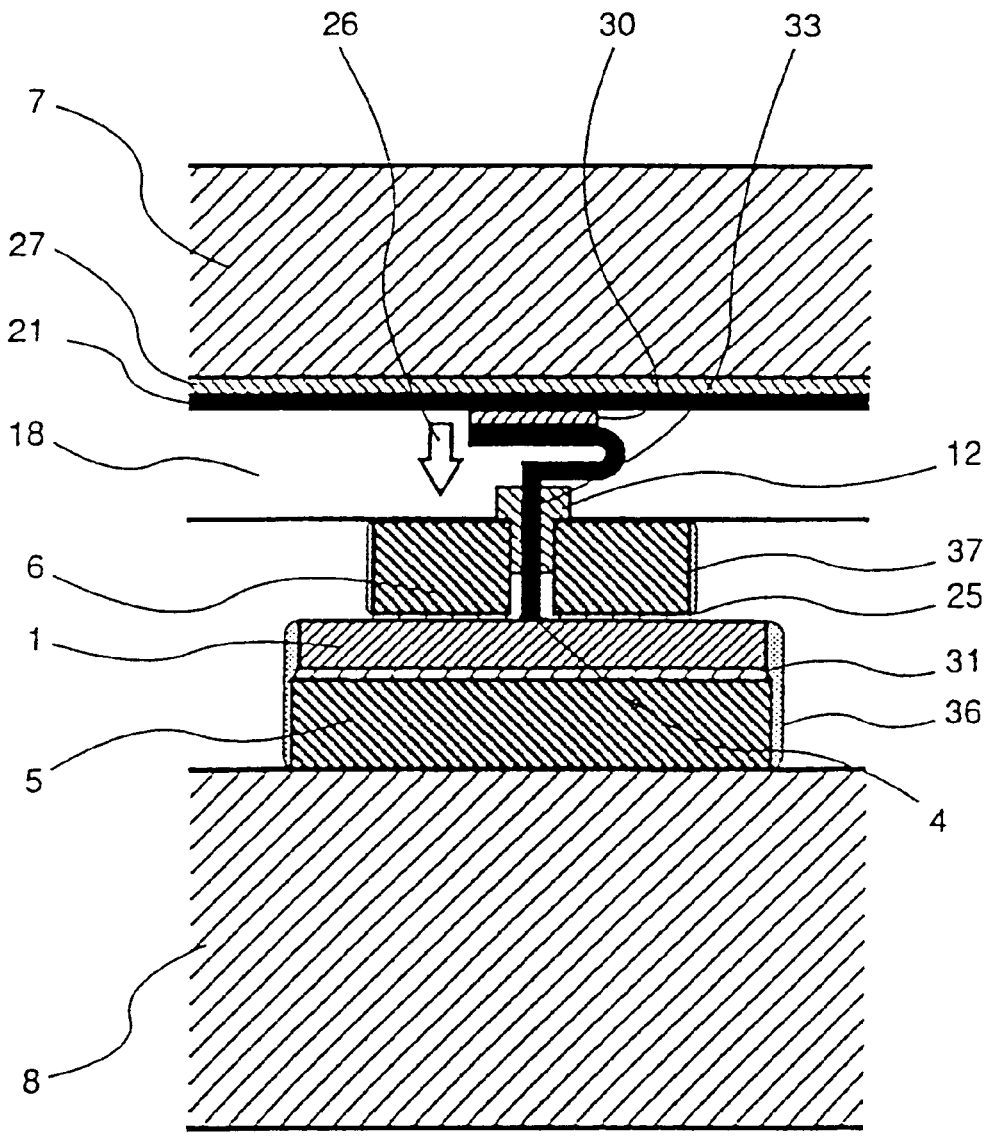
FIG. 7 is a sectional view in parallel to the control electrode wire net of the semiconductor device according to a fourth embodiment of the present invention.

Referring to FIG. 5 to FIG. 7, there are shown some preferred embodiments of a control electrode wire net of the present invention. FIG. 5 to FIG. 7 are all sectional views in parallel with the control electrode wire net formed on the common electrode 7. As shown in FIG. 5, intermediate electrodes 5 and 6 are respectively placed between the IGBT chip 1 and the common electrode plate 7 or 8. Said intermediate electrodes 5 and 6 are plated with gold (Au) in advance. The aluminum emitter electrode and the aluminum collector electrode of the semiconductor chip 1 are respectively bonded to the intermediate electrodes 5 and 6 with junction layers which have gold as the main ingredient. The lead-out pin 11 whose length is adjusted is kept perpendicular to the surface of the semiconductor chip via the insulating member 12 and pressed against the control electrode wire net 21 set in the groove 18 of the common electrode 7. The insulating member 23 is made of a heatproof elastic resin. When pressed by the lead-out pin 11, the insulating member elastically deforms and its restoring force generates a force 26 which causes the pin 11 to push against the control electrode pad 4 on the semiconductor chip. This makes the front end of the pin 11 close contact with the control electrode 4.

FIG. 6 shows another embodiment of giving a force to push the pin against the control electrode on the semiconductor chip. The control electrode wire net 21 is made of a metallic material such as phosphor bronze, nickel silver or beryllium copper which has a high yielding point and is too tough to cause fatigue deformation. The insulating member 27 is made of a hard heatproof resin and has a hole made at a position where the lead-out pin is located so that the wire material can deflect easily.

When the pin 28 is pressed against this part, the control wire deflects and generates a restoring force. This downward force 26 assures close contact of the pin to the control electrode.

In this embodiment, the pin 28 has a circular or rectangular head 29 on its top and a chip resistor 30 is soldered to this head to prevent oscillation. This chip resistor can be soldered to the control electrode wire net. It is also permitted to leave the chip resistor unsoldered to the control electrode wire net. There can be another method of fitting or soldering a resistor-mounted socket which is separately manufactured to the straight pin without a head. In this embodiment, the collector side of the chip 1 is soldered (31) to the intermediate electrode 5 but the emitter side of the chip is not soldered to the intermediate electrode 6. In this case, an auxiliary frame 32 which is made of a heatproof resin such as Teflon or silicon is used to retain the position of the intermediate electrode 6 in the emitter side relative to the chip 1 or the intermediate electrode 5 in the collector side. This can always retain the relative pin-chip position constant. As this method does not require precise external dimensions of the auxiliary frame 32, the frame can be made thinner and loosely machined. This can reduce the cost of the part. The auxiliary frame 32 can also work to assure insulation and mechanical protection of chip ends. To assure chip insulation only, the auxiliary frame 32 can be substituted by a frame or flat member of a lower machining precision. It is also effective to cover the ends and sides of the chip with adhesives such as silicon, polyimide, or the like.

FIG. 7 shows a further embodiment of the present invention which gives elasticity to the lead-out pin. The pin 33 for leading out a wire from the control electrode 4 on the semiconductor chip has a U-shape on the upper part. This U shaped part generates a vertical spring force. The length of the lead-out pin 33 is made a little greater than the distance between the control electrode 4 and the control electrode wire net 21 of the completed package (including the tolerance) so that the pin may be held perpendicular to the semiconductor via the insulating member 12 and pressed against the control electrode wire net 21 set in the groove 18 of the control electrode 7. In this status, the pin 33 generates a force 26 to push itself against the control electrode pad 4 and consequently the close contact of the pin 33 to the control electrode 4 is assured.

Further in this embodiment, the ends of the chip and the sides of the intermediate electrodes are covered with silicone and polyimide adhesives 36 and 37 for protection. In addition to this, the aluminum electrode in the emitter side of the IGBT chip is bonded to the silver-plated intermediate electrode 6 with an adhesive layer 25 including silver (Ag). The silver electrode formed on the collector surface of the chip 1 is bonded to the nickel-plated intermediate electrode 5 in the collector side via a solder sheet 31.

Figure 8:
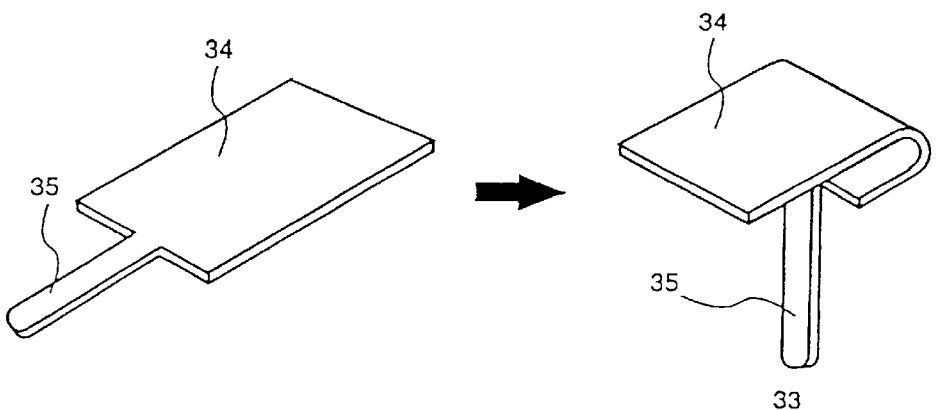
FIG. 8 is a 3-dimensional view of a lead-out pin used in FIG. 7 illustrating how the lead-out pin is formed.

FIG. 8 shows how said pin 33 is prepared. To reduce the manufacturing cost, the pin base having a wide pin head part and a narrow pin leg part is punched out from a metallic sheet such as phosphor bronze sheet and the wide part of the punched pin base is bent and curved as shown in the drawing. The formed pin is nickel-plated and a resistor chip 30 is soldered to the pin head. This pin assembly is presented for assembly of the package.

As the package becomes greater, the resistances of wires between the control electrodes and their mating semiconductor chips become dispersed more and more. To equalize the operations of a great number of semiconductor chips which are connected in parallel in the package, it is preferable to reduce the resistance of each control electrode wire connected to the mating semiconductor chip down to one tenth or less of the resistance of the resistor attached to each semiconductor chip. This means that the dispersion of the gate resistance between a gate input terminal and each semiconductor chip is 10% or less. This enables low-precision circuit designing and reduction of circuit designing costs.

As described above, it is not always required that an intermediate electrodes is provided between a semiconductor chip and a primary or secondary common electrode plate. However, it is preferable to provide an intermediate electrode made of high electrically and thermally conductive material having a thermal expansion coefficient approximately equal to the average of thermal expansion coefficients of the members or the thermal expansion coefficient of the semiconductor chip. Such materials are simple metal substance such as tungsten (W) and Molybdenum (Mo), composite materials or alloy containing said metal substance as the main ingredient such as Cu—W, Ag—W, Cu—Mo, Ag—Mo, and Cu—Fe Ni, and composite materials of metals, ceramics, and carbon such as Cu—SiC, Cu—C, Al—SiC, and Al—AlN. As for the control electrodes, such materials are copper, aluminum, and composite materials and alloys which are described above.

The simplest form of an intermediate electrode part which leads out a control electrode wire in the emitter side of the chip is a through-hole formed in the center. However, it can be an eccentric hole, a notch made on the end of the electrode, a rectangular hole or a plurality of said holes according to the position, shape and the number of control electrode pads. The intermediate electrode can be either circular or rectangular in the external shape, but the intermediate electrode provided in the emitter side should be so shaped that the intermediate electrode may not be in contact with the pressure-proof structure formed on the end of the chip. Furthermore, it should not be in contact with the control electrode and the surface of the intermediate electrode in contact with the chip is preferably ring-shaped, comb-shaped, single-tooth-shaped, dice-cut-shaped, or a combination of these shapes according to the position, shape, and the number of emitter electrode pads. On the other hand, the intermediate electrode in the collector side should be flat and as wide as possible to get a wider contact area. Furthermore, these intermediate electrodes can be disposed individually for each semiconductor chip or a large single intermediate electrode can be used.

In all of said embodiments, the control electrode pad is formed in the center of the main surface of a semiconductor chip. However, it can be formed on one corner of the chip and further a plurality of control electrode pads can be provided on a single chip. Any other areas on the primary main surface of the semiconductor chip than the control electrode pad and the end area of the chip are used for connection of the primary main electrode (emitter electrode) and have an aluminum or aluminum-silicon electrode there. Further the primary main surface of the chip can have electrodes to detect an overcurrent besides the control electrode. It is preferable to cover all areas on the primary main surface of the semiconductor chip excluding said control and emitter electrode areas with a passive film made of polyimide resin or the like for protection.

Above are explained embodiments in which each semiconductor chip is bonded to an intermediate electrode or a common electrode with solder, gold (Au) or silver (Ag) and the intermediate electrodes are bonded to the common electrodes in the same manner. However, it is to be expressly understood that said bonding is for purpose of explanation and is not intended as a definition of the limits of the invention. It is also possible to install said parts without bonding them.

When a plurality of semiconductor chips are housed in parallel in a flat-type package, it is very important to equalize the heights of members (semiconductor chips and intermediate electrodes) to be placed between a pair of common electrodes of the package and assure the close contact of the members to the common electrodes. For this purpose, a high electrically-conductive flexible film or sheet member of high heat conductivity is preferably placed between the semiconductor chip and the common electrode plate or the intermediate electrode. A uniform close contact of members can be accomplished by piling semiconductor chips, intermediate electrode sheet, and said film or sheet member on the common electrode plate and pressing thereof in a unit at a room temperature or in a heated status in the assembling or final packaging step. Said film or sheet member plastically deforms to eliminate the dispersion in heights of semiconductor chips and puts the top surfaces of semiconductor chips in the same level. This assures uniform close contact of members. Said film or sheet member is preferably a metal such as gold, silver, copper or aluminum, alloy of said metals, alloy or composite material containing said materials as the main ingredients, or a thermoplastic conductive sheet such as a solder sheet.

In case the common electrode is not bonded to the semiconductor chip or to the intermediate electrode, it is very significant that the common electrode is in close contact with the semiconductor chip or to the intermediate electrode to reduce the thermal resistance. Said method is valid also for this purpose. Further, another method is also effective which deposits, by evaporation, a high electrically-conductive and flexible metallic film of high thermal conductivity such as gold, silver, copper or aluminum on at least one of the surfaces to be in close contact with each other. It is also preferable to use a combination of different film materials for each junction part to accomplish both height correction and reduction of thermal resistance at a time. Namely, height correction and reduction of thermal resistances can be accomplished comparatively easily by inserting a soft metallic sheet such as silver (Ag) between the common electrode and the intermediate electrode and a thin silver film between the intermediate electrode and the conductor chip.

Although FIG. 3 shows an example of a circular common electrode or package, a rectangular semiconductor device can also exist. In this case, the semiconductor device had better contain a rectangular insulating outer cylinder. If a small number of semiconductor chips are installed, rectangular chips can occupy less areas than circular chips and consequently can make the semiconductor device more compact. Contrarily, if a large number of semiconductor chips are installed, whether the outer shape of the semiconductor chips is rectangular and circular is not so important because rectangular and circular semiconductor chips occupy approximately the same areas. Select the outer shape of the package considering the other factors such as manufacturing costs of packaging materials.

If a flat-type semiconductor device containing a number of semiconductor chips which are disposed in parallel has unbonded areas particularly between the control electrode and the built-in chips and between the control electrode and the intermediate electrode, it is preferable to make said members close-contact with each other by pressing the both surfaces of the control electrodes which are exposed to the outside. In this case, this uniform pressing is more effective to the circular packages than to the rectangular packages.

Generally, when the breakdown voltage of an IGBT element increases, its loss increases and the element generates greater heat in operation. This limits the current density. Therefore, a semiconductor device of high breakdown voltage and large ampacity requires a great number of chips in parallel. Particularly, said method of the present invention is fit for such a requirement. Said method makes wiring in the package compact and reduces thermal resistances. Contrarily, the number of chips to be installed must be as small as possible to reduce the number of work steps and production costs. Namely, each chip must be as big as possible as far as the production cost allows. Chips of 14 mm square or bigger are preferable. FIG. 19 shows a table listing high-breakdown-voltage and large-ampacity flat-type semiconductor devices containing IGBT chips and diode chips of 14 mm square to 16 mm square in which the number of IGBT chips is approximately twice the number of diodes.

As for reverse-conducting flat-type semiconductor devices, if the FWD chips and IGBT chips are of the same size, they can be located freely in the package. This increases the number of degrees of freedom in the distribution ratio of chips and enables high-density installation of chips. As the result, semiconductor devices of various ratings can be produced easily. Furthermore, as the packaging method of the present invention basically offers package structures which are independent of kinds of chips regardless of existence of control electrodes, packages satisfying the above requirement can be easily produced. The IGBT chips and the FWD chips are preferably dispersed as uniformly as possible in the package to equalize heat generation thereof.

Each of said embodiments of the present invention is explained using IGBT chips as semiconductor elements with a control electrode. However, the present invention is for all semiconductor elements having at least a primary main electrode on the primary main surface and a secondary main electrode on the secondary main surface and is also applicable to diodes and semiconductor elements with a control electrode such as insulated gate thyristors (MOS controlled thyristors) including IGCTs (Insulated Gate Controlled Thyristors) and insulated gate transistors (MOS transistors) excluding the IGBTS.

Similarly, the present invention is also applicable to semiconductor elements made of compounds such as SiC and GaN other than Si elements.

As said flat-type housing semiconductor device in accordance with the present invention can contain a great many chips densely in a limited space, it is apparent that large-capacity power converting equipment greatly reducing its volume and production cost can be produced.

Referring to FIG. 9 to FIG. 16, there are shown some preferred embodiments of self-excited large-capacity power converting devices employing flat-type IGBT semiconductor devices in accordance with the present invention.

Figure 9:
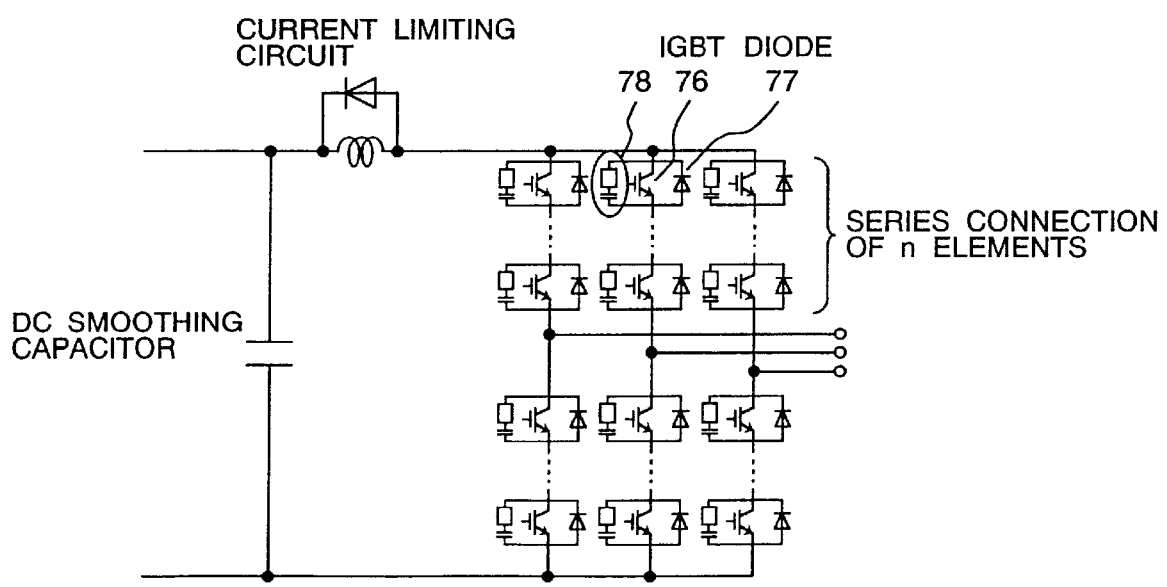
FIG. 9 is a circuit diagram illustrating a configuration of one bridge of a semiconductor device of the present invention.

FIG. 9 shows a circuit diagram of one bridge of said semiconductor device including n pieces of serially-connected elements each of which has main converting elements (IGBT 76 and diode 77) disposed in reverse parallel. These IGBT and diode chips indicates a flat-type semiconductor device having a number of semiconductor chips in parallel in accordance with present invention. Said flat-type reverse-conducting IGBT semiconductor device comprises a snubber circuit 78, a current limiting circuit, and a plurality of packages each of which consists of the IGBT chip 76 and the diode 77.

Figure 10:
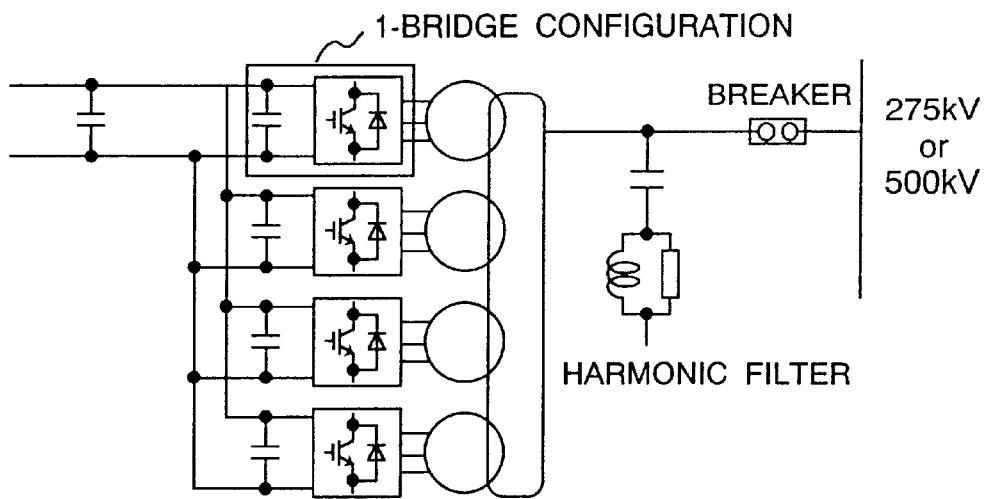
FIG. 10 is a block diagram of a self-commutated converter which comprises four sets of 3-phase bridges of FIG. 9.

FIG. 10 is a circuit diagram of a self-excited converter having four sets of 3-phase bridges of FIG. 9.

Figure 11:
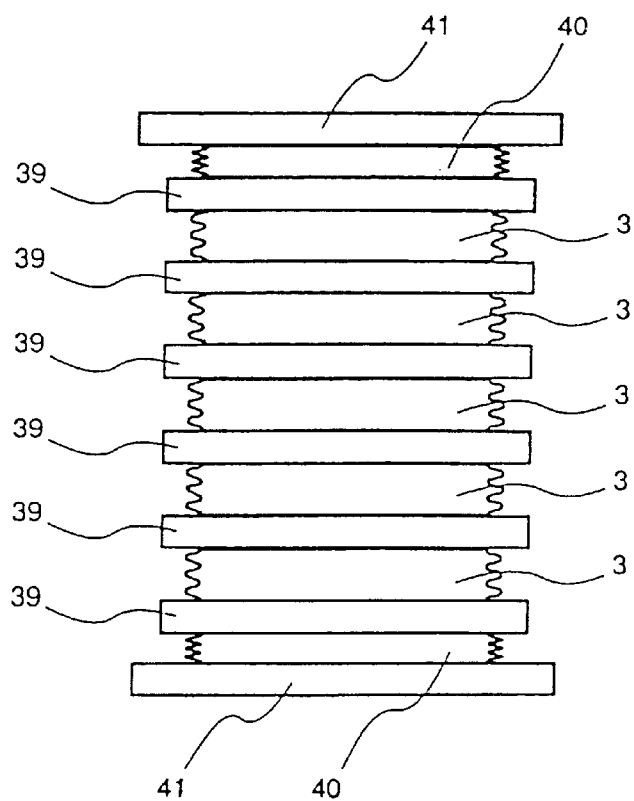
FIG. 11 is a plane view illustrating the structure of a stack which serially connecting semiconductor devices of the present invention.

FIG. 11 shows a stack comprising five flat-type semiconductor devices of the present invention which are pressure-connected serially. The five flat-type semiconductor devices 3 are serially connected with a water-cooled electrode 39 placed between the consecutive two of the semiconductor devices 3. The outer surfaces of the common electrodes of the semiconductor devices 3 are respectively in close contact with the surfaces of the water-cooled electrodes 39. Each end of the stack is equipped with a high-voltage insulator 40 and the whole stack assembly is pressure-held by a structural member 41.

In accordance with the present invention, even a flat-type semiconductor device of a breakdown voltage of 5 KV and a current rating of 3 KA can be made smaller (approximately 300 mm in diameter by 40 mm thick or less). Therefore, the whole stack also becomes very compact, for example, approximately 400 mm wide by 400 mm long by 550 mm high.

Figure 12:
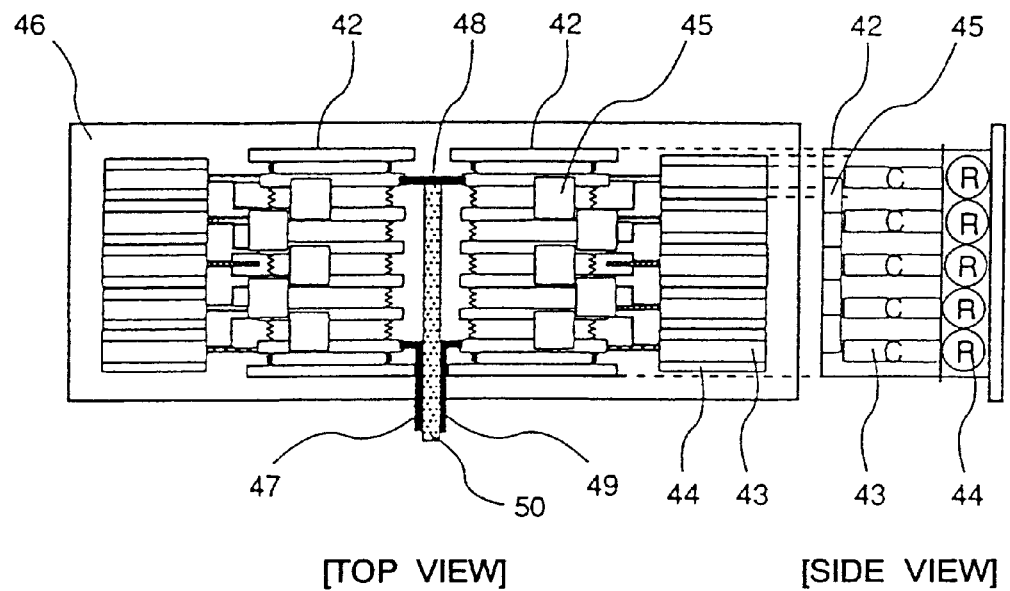
FIG. 12 illustrates the structure of a module which comprises two stacks of FIG. 11.

FIG. 12 shows top and side sectional views of a module 46 comprising two of said stacks, snubber circuits containing a snubber capacitor 43 and a snubber resistor 44, and gate driver circuits 45.

These two stacks are connected serially by main circuit wires 47, 48, and 49. The stacks and the wires are insulated from each other by the insulating plate 50. In this embodiment, main circuit wires are placed in parallel along the center axis of the stack so that the main currents in the stacks may flow in parallel and reversely to reduce the wiring inductance.

Figure 13:
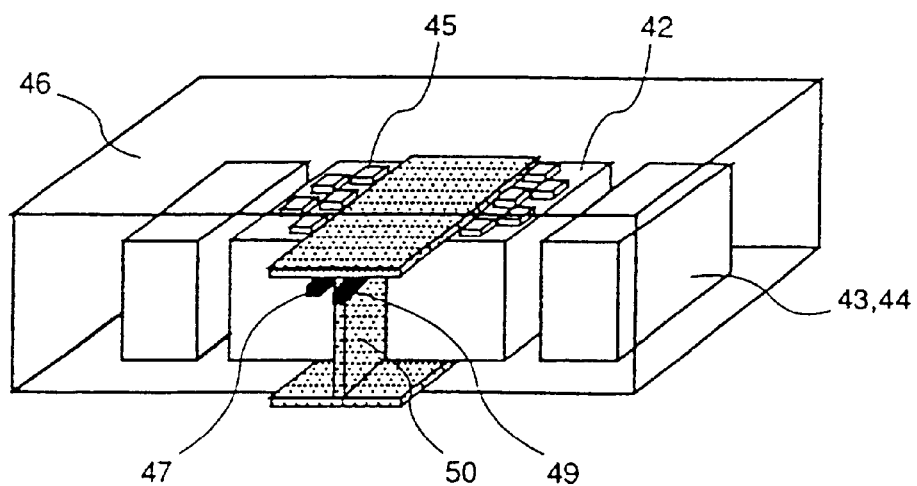
FIG. 13 is a 3-dimensional view of the module structure of FIG. 12.

FIG. 13 is a simplified three-dimensional perspective view of said module of FIG. 12.

Figure 14:
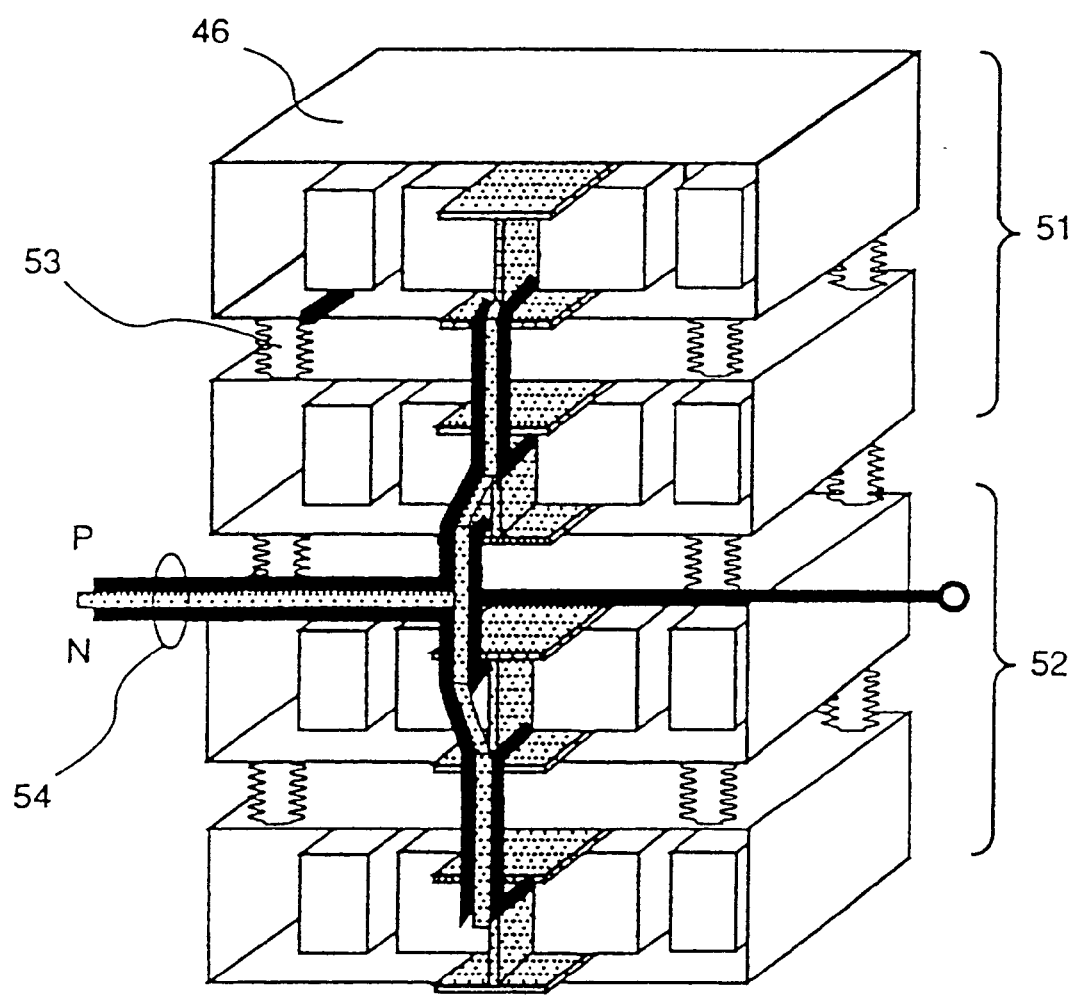
FIG. 14 is a 3-dimensional view of a 2-arm configuration which comprises four module structures of FIG. 13.

FIG. 14 is a simplified three-dimensional perspective view of an embodiment comprising four said modules 4 of FIG. 13 to form two arms (upper one arm 51 and lower one arm 52) for one phase with forty flat-type semiconductor devices of the present invention. Said modules are insulated from each other by an insulating material 53. To reduce the inductance of the main circuit wire, a parallel conductor plate (a laminated bus bar) is used as a main circuit wiring which interconnects the stacks.

Figure 15:
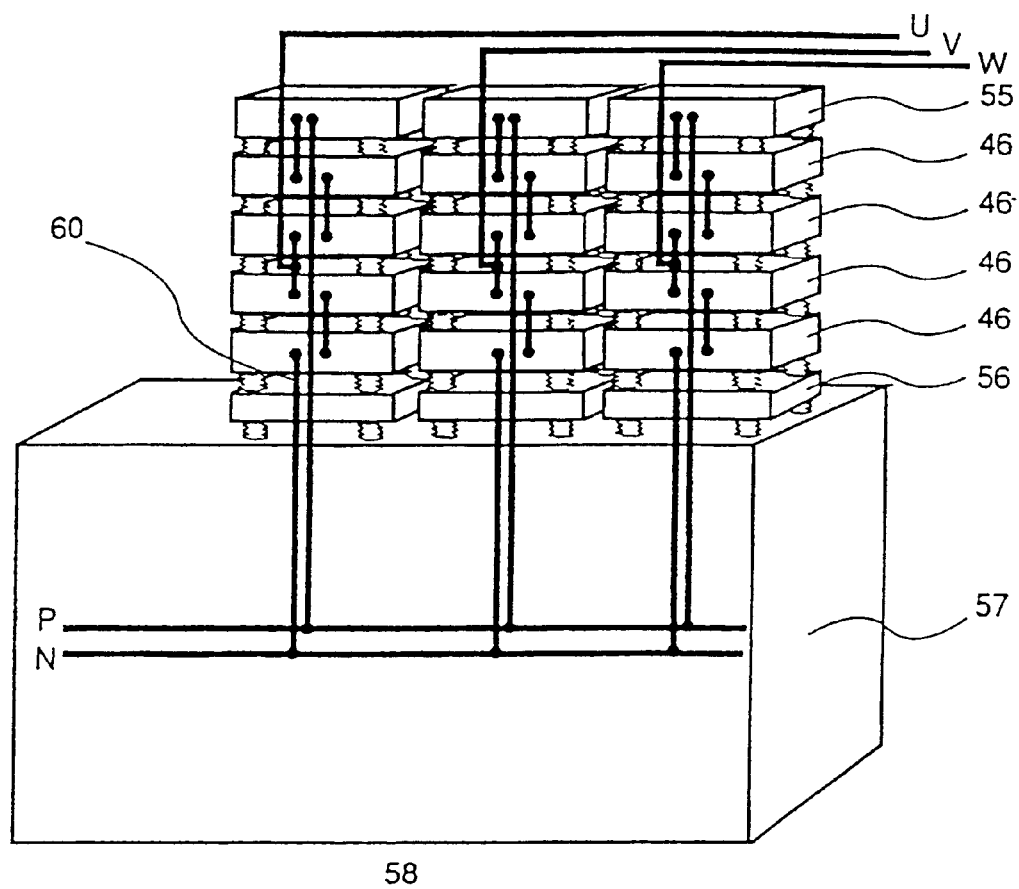
FIG. 15 is a 3-dimensional view of a 3-phase bridge configuration using the semiconductor devices of the present invention.

FIG. 15 is a simplified three-dimensional perspective view of 1 3-phase bridge comprising three sets of said embodiment of FIG. 14, current-limiting modules 55, cooling-water controlling modules 56, and a direct-current capacitor 57.

Figure 16:
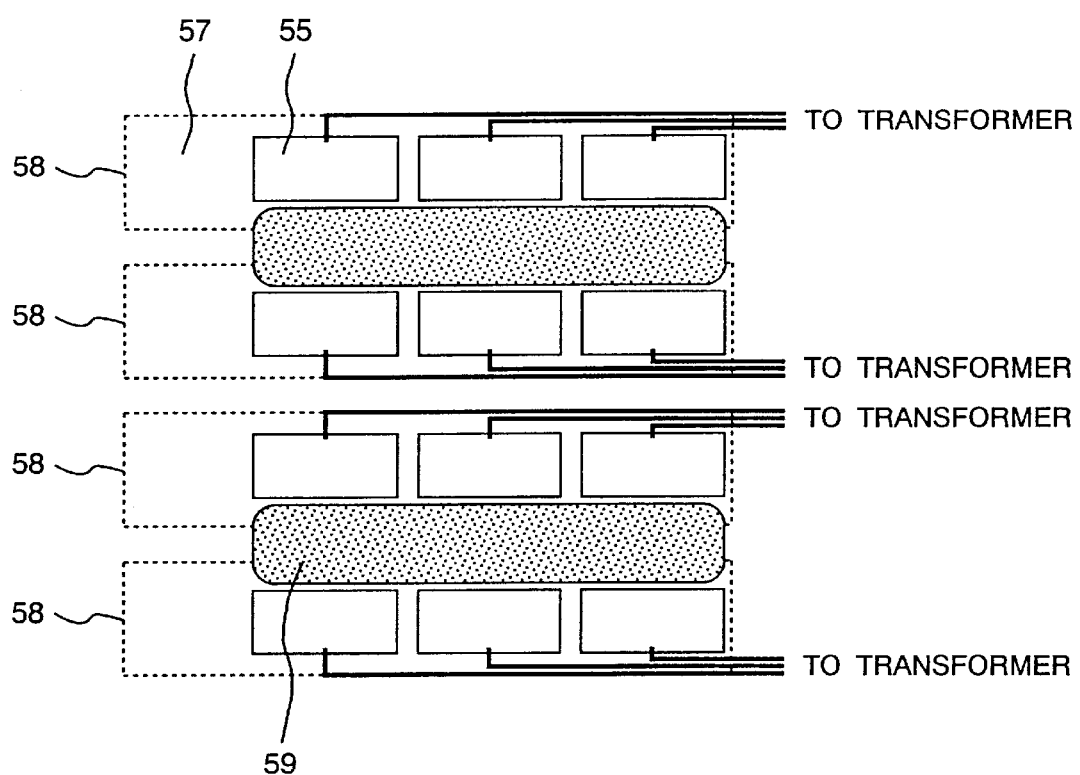
FIG. 16 is a layout of a valve hole which comprises four sets of 3-phase bridges of FIG. 15.
Figure 17:
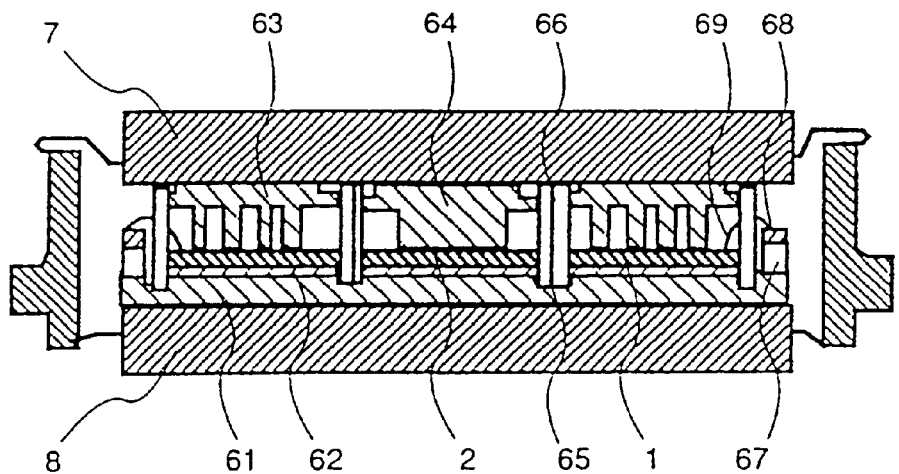
FIG. 17 is a sectional side view of a conventional semiconductor device.
Figure 18:
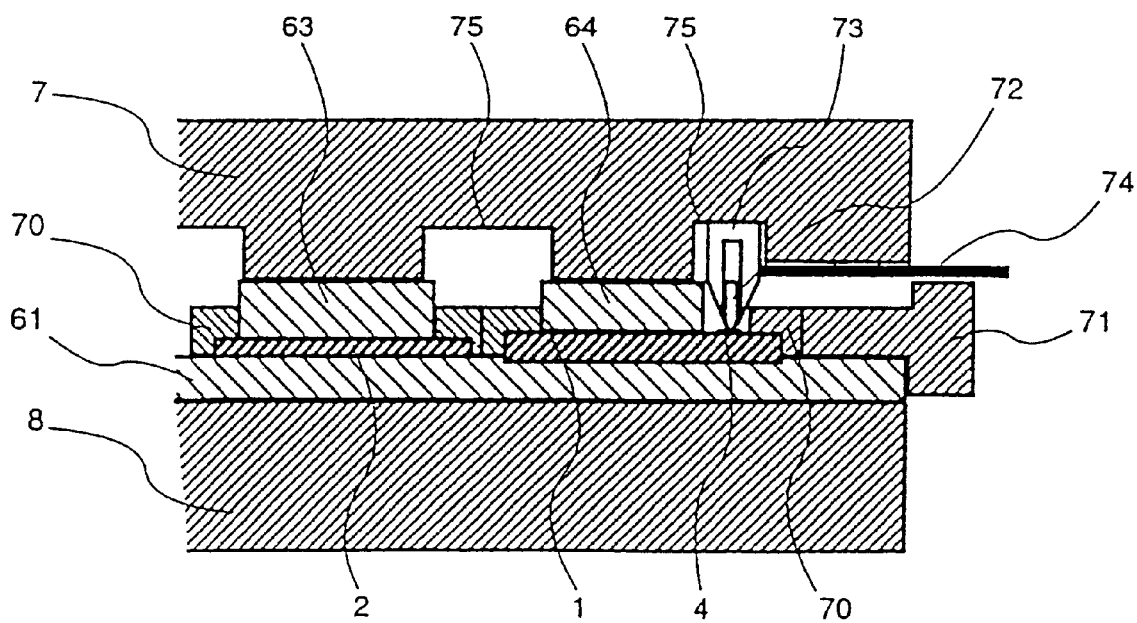
FIG. 18 is a sectional side view of a conventional semiconductor device.

FIG. 16 shows a layout of valve holes in a 300-MW class power converter system which comprises four 3-phase bridges 58 of FIG. 15. The dimensions of said 3-phase bridge in this system are approximately 8000 mm by 1500 mm by 8000 mm (or 5800 mm by 1000 mm by 3800 mm excluding the direct-current capacitor 57), which means that the converter itself is much smaller than that using conventional elements (GTO and the like). As the result, wires 60 required in the converter can be shortened greatly and the calculated inductance of a wire (not including the effect by parallel wiring) is 1.5 microhenry or less per element, which is half the conventional inductance or less. This can also reduce the number of peripheral units, make the system light-weighed, and reduce the whole production cost.

Said flat-type semiconductor device of the present invention is applicable not only to said embodiments but also to large-capacity power converting devices whose conversion capacity is 10 MVA or more. It is preferably applicable to self-excited large-capacity converting equipment whose conversion capacity is 50 MVA or more for power systems and to large-capacity power converting equipment which is used as a power converter for mills. Said flat-type semiconductor devices can also be used for pumping-up power plants, rolling mills, substations in buildings, substations for railway companies, NaS cell systems, and so on.

According to the present invention, said semiconductor device having a plurality of semiconductor chips which are disposed in parallel has a self-alignment structure in which members for forming control electrode wires required to control operation of each semiconductor chip, that is lead-out electrodes, and their insulating members always work to align the control electrodes and lead-out wires and to position each semiconductor chip in the package. This structure eliminates positional movements of members due to thermal expansions of different members and troubles due to stresses of members in the package, and increases the chip density in the package.

Further, said flat-type package of the present invention has a structure to set a control electrode wire net in the grooves of the control electrode. This structure can greatly simplify wiring of control electrodes in the package, consequently increasing the working ability and package reliability greatly. Furthermore, this makes packages thin and compact and consequently reduces the thermal resistances. Additionally, the control electrode wiring of this method is hard to be affected by the main circuit wiring and consequently reduces the noise influence on the gate wiring.

As described above, said method of the present invention enables production of flat-type housing semiconductor devices having a number of semiconductor chips which are disposed in parallel. Said method facilitates production of large-capacity semiconductor devices of a rated voltage of 3.5 KV and a rated current of 1 KA or more, a rated voltage of 5 KV and a rated current of 3 KA or more, and so on. Further, large-capacitance power converting equipment using said semiconductor devices of this invention can reduce its volume and production costs greatly. This compactness greatly reduces the inductance of d.c. wiring and thus increases the voltage utilization factor of elements.

What is claimed is:

1. A flat-type semiconductor device housing a plurality of parallel-disposed semiconductor chips, each having a primary main electrode and a control electrode on a primary main surface side of each semiconductor chip and a secondary main electrode on a secondary main surface side thereof, in a flat package having a pair of externally-exposed common electrodes and an insulating cylinder insulating between the pair of common electrodes, wherein intermediate electrodes, which are electrically conductive and thermally radiative, are respectively provided at least at the primary main surface side of each semiconductor chip between the primary main electrode and one of the common electrodes, and at the secondary main surface side of each semiconductor chip, between the secondary main electrode and the other of the common electrodes;

wherein the intermediate electrodes and the respective primary and secondary main electrode of the semiconductor chip are bonded to one another;

and wherein a control electrode wire led out from a control electrode of each semiconductor chip and an insulating member for insulating each control electrode wire serve to determine the position of each semiconductor chip.

2. A flat-type semiconductor device as claimed in claim 1, wherein said semiconductor device has a structure for determining the position of said intermediate electrode relative to the common electrode when the insulating member for insulating the control electrode wire led out from the control electrode of each semiconductor chip connects a through-hole or notch formed on said intermediate electrode provided in the primary main electrode side to a hole or groove formed on a predetermined position of a common electrode opposite to the primary main electrode of said semiconductor chip.

3. A flat-type semiconductor device housing a plurality of parallel-disposed semiconductor chips, each having a primary main electrode and a control electrode on a primary main surface of each semiconductor chip and a secondary main electrode on a secondary main surface thereof, in a flat package having a pair of externally-exposed common electrodes on both ends, wherein a gap between the common electrodes is insulated from the outside by an insulating cylinder, wherein intermediate electrodes which are electrically conductive and thermally radiative is provided at least at the primary main electrode side between the primary main electrode of each semiconductor chip and one of said common electrodes, and at the secondary main electrode side, between the secondary main electrode and the other of the common electrodes;

wherein the intermediate electrodes and the respective primary and secondary main electrodes are bonded to one another, and wherein a control electrode wire led out from a control electrode of each semiconductor chip and a member for insulating each control electrode wire serve to determine the position of each semiconductor chip.

4. A flat-type semiconductor device housing a plurality of parallel-disposed semiconductor chips having at least a primary main electrode on a primary main surface of each semiconductor chip and a secondary main electrode on a secondary main surface thereof in a flat package having a pair of externally-exposed common electrodes on both ends, wherein a gap between the common electrodes is insulated from the outside by an insulating cylinder, wherein:

an intermediate electrode, which is electrically conductive and thermally radiative, is provided at least at the primary main electrode side between the primary main electrode of each semiconductor chip and one of the common electrodes, and, at the secondary main electrode side, between the secondary main electrode and the other of the common electrodes, and said semiconductor device has a structure for determining the position of said intermediate electrode relative to the common electrode when an insulating member for insulating a control electrode wire led out from a control electrode of each semiconductor chip from the main electrode wire connects a through-hole or notch formed on said intermediate electrode provided at the primary main electrode side to a hole or groove formed on a predetermined position of a common electrode opposite to the primary main electrode of said semiconductor chip.

* * * * *